(12) United States Patent
Mattes et al.

(10) Patent No.: US 7,558,991 B2
(45) Date of Patent: Jul. 7, 2009

(54) DEVICE AND METHOD FOR MEASURING JITTER

(75) Inventors: Heinz Mattes, Munich (DE); Sebastian Sattler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 378 days.

(21) Appl. No.: 11/440,441

(22) Filed: May 25, 2006

(65) Prior Publication Data

US 2006/0291548 A1 Dec. 28, 2006

(30) Foreign Application Priority Data

May 25, 2005 (DE) ............ 10 2005 024 649

(51) Int. Cl.
*G11B 20/20* (2006.01)
*G01R 31/28* (2006.01)
*G01R 29/26* (2006.01)
*H04B 3/26* (2006.01)

(52) U.S. Cl. .......... 714/700; 375/226; 702/69; 714/738

(58) Field of Classification Search .......... 714/700, 714/738; 375/226; 702/69
See application file for complete search history.

(56) References Cited

U.S. PATENT DOCUMENTS

| | | | |
|---|---|---|---|
| 4,093,988 A * | 6/1978 | Scott ............. | 702/77 |
| 5,287,296 A | 2/1994 | Bays et al. | |
| 5,754,601 A | 5/1998 | Horng et al. | |
| 5,948,115 A * | 9/1999 | Dinteman ........... | 714/738 |
| 6,111,532 A | 8/2000 | Hirano et al. | |
| 6,148,048 A | 11/2000 | Kerth et al. | |
| 6,184,812 B1 | 2/2001 | Younis et al. | |
| 6,249,876 B1 | 6/2001 | Balakrishnan et al. | |
| 6,278,394 B1 | 8/2001 | May | |
| 6,396,877 B1 | 5/2002 | Hollenbach et al. | |

(Continued)

FOREIGN PATENT DOCUMENTS

EP 1508813 2/2005

(Continued)

OTHER PUBLICATIONS

"Jitter in Digital Communication Systems, Part 1", MAXIM, Application Note, HFAN-4.0.3, Rev O; Sep. 2001.

(Continued)

*Primary Examiner*—James C Kerveros
(74) *Attorney, Agent, or Firm*—Edell, Shapiro & Finnan, LLC (57) ABSTRACT

A test device contains a data pattern generator for providing a delta-sigma-modulated data stream sampled with a sampling frequency $f_s$ at its output. A phase modulator generates a test clock subjected to jitter and having the clock frequency $f_t$ at its output. The output of the data pattern generator is connected to a terminal for connection to a data input of a semiconductor component to be tested. The output of the phase modulator is connected to a terminal for connection to a clock input of a semiconductor component to be tested. An evaluation device determines the jitter parameters of the input signal at the input of the data device from the low-frequency component of the input signal. In this case, the low-frequency component contains only frequency components of frequencies which are less than half the sampling frequency $f_s/2$.

34 Claims, 7 Drawing Sheets

U.S. PATENT DOCUMENTS

| | | | |
|---|---|---|---|
| 6,414,615 B1 | 7/2002 | Cheng | |
| 6,452,531 B1 | 9/2002 | Miller et al. | |
| 6,462,687 B1 | 10/2002 | Eshraghi et al. | |
| 6,480,129 B1 | 11/2002 | Melanson | |
| 6,522,122 B2 * | 2/2003 | Watanabe et al. | 324/76.77 |
| 6,528,982 B1 * | 3/2003 | Yanagisawa et al. | 324/76.77 |
| 6,614,849 B1 * | 9/2003 | Chan et al. | 375/259 |
| 6,687,868 B1 * | 2/2004 | Furukawa et al. | 714/740 |
| 7,010,444 B2 * | 3/2006 | Nishikobara et al. | 702/69 |
| 7,103,800 B2 * | 9/2006 | Hasako et al. | 714/25 |
| 7,397,847 B2 * | 7/2008 | Ishida et al. | 375/226 |

FOREIGN PATENT DOCUMENTS

| | | |
|---|---|---|
| WO | WO 03/060533 | 7/2003 |

OTHER PUBLICATIONS

Hewlett Packard: Application Note 1267: Frequency agile jitter measurement system. Hewlett-Packard Company, Santa Clara, USA Apr. 1995, Document 5963-5353E, p. 1-28 (http://cp.literature.agilent.com/litweb/pdf/5963-5353E.pdf).

A. Teplinsky and O. Feely, "Phase jitter dynamics in second-order DPLLs with irrational and integer input frequencies," in Proc. IEEE Int. Symp. Circuits and Systems, Orlando, Jun. 1999.

Bellcore GR-253-CORE, "Synchronous Optical Network (SONET) Transport Systems: Common Generic Criteria," Issue 2, Dec. 1995, Chapter 5.6, Jitter.

Bellcore GR-499-CORE, "Transport Systems Generic Requirements (TSGR): Common Requirements," Issue 1, Dec. 1995, Chapter 7, Jitter.

* cited by examiner

DEVICE AND METHOD FOR MEASURING JITTER

CROSS REFERENCE TO RELATED APPLICATIONS

This application claims priority to German Application No. DE 102005024649.4, filed on May 25, 2005, and titled "Device and Method for Measuring Jitter," the entire contents of which are hereby incorporated by reference.

BACKGROUND

Data transmission systems such as, e.g., SONET/SDH, require that the system clock be complied with very precisely. Fluctuations in the system clock, if they exceed a permissible tolerance threshold, may lead to incorrect assessments of the received signal and thus initiate a bit error.

Real clock generators are always subjected to such fluctuations. In this case, fluctuations may affect not only the clock frequency but also the phases of the rising edges or of the falling edges. In this case, by way of example, the edge of the clock signal sometimes occurs somewhat earlier and sometimes occurs somewhat later. This behavior is referred to as jitter. The following definition for jitter is used hereinafter.

Jitter denotes the periodic and stochastic deviations of the core instants of a digital signal relative to their ideal, equidistant core instants. The core instant of a digital signal may be any customary, easily identifiable point of the signal, such as, e.g., the rising or falling edge or the sampling instant. Consideration is given for example to a square-wave clock signal $$u(t) = \text{square}(f_1 t)$$
$$\text{where square}(x) = \begin{cases} 1 \text{ for } 0 \leq x < 0,5 \\ 0 \text{ for } 0.5 \leq x < 1 \end{cases}$$
$$\text{and square}(x) = \text{square}(x+n), \quad n, \text{ integer.}$$

This square-wave clock signal is then acted upon by a periodic jitter signal where $$j(t) = \beta * \sin(2\pi f_j t + \Phi)$$

This produces a signal subjected to jitter where $$u(t) = \text{square}(f_1 t + \beta \sin(2\pi f_j t + \Phi)).$$

In this case, $\beta$ emits the jitter amplitude, $f_j$ indicates the jitter frequency and $\Phi$ indicates the jitter phase offset. Electrical components, e.g., transmitters or transceivers in data transmission systems, have to satisfy specified requirements with regard to their jitter parameters. One requirement is, e.g., the jitter tolerance. This defines what jitter can be applied to a semiconductor component without the data transmission error rate increasing.

The characteristic value of the jitter transfer coefficient indicates the magnitude of the ratio between the jitter amplitude at the output of the component and the jitter amplitude at the input of the component.

When testing the components with regard to their jitter behavior it is necessary to use very complicated test devices, because the jitter measurements have to be effected with high precision.

In application note 1267 "Frequency Agile Jitter Measurement System" from Agilent Technologies, the section "Jitter transfer measurement setup" describes a test device for measuring the jitter transfer coefficient, in which test device a digital signal generator feeds a predefined or a random data sequence to a semiconductor component to be tested. The clock is likewise generated in the signal generator and a deterministic or statistical jitter signal is modulated onto the clock.

The input clock beset with jitter is fed to a first input of a jitter measuring instrument, on the one hand, and is connected to the clock input of the semiconductor component to be tested, on the other hand. A clock is recovered from the output data stream of the component. This recovered clock is fed into a second input of a jitter measuring instrument.

The jitter measuring instrument compares the input clock with the recovered output clock and from this determines the extent to which the recovered clock still contains the input jitter. Extremely high demands are made of the measurement technology particularly in the jitter measuring instrument and in the signal generator. High-precision testers and measuring instruments are used particularly at high frequencies. These high-precision testers and measuring instruments are very sensitive and expensive. Moreover, the labor for setting and calibrating these testers and measuring instruments is high.

SUMMARY

The invention provides a test device and a method with which jitter in signals is measured in a less complicated manner and thus less expensively. The test device includes a data pattern generator that generates a data stream at its output by modulating a low-frequency analog basic signal via a sampling frequency $f_s$. The basic signal has a frequency $f_c$ or is a combination of signals with different basic frequencies $f_{ci}$, where i is a running variable. The sampling frequency $f_s$ is greater than the basic frequency $f_c$ or the basic frequencies $f_{ci}$. In this case, the modulation has the "noise-shaping" property. The latter means that the error signal caused by the modulation is shifted toward very high frequencies. The power density spectrum of the modulating signal, by contrast, remains in baseband. In this case, the baseband is situated at the frequency of the basic signal.

The test device furthermore includes a jitter generator. According to one option, the jitter generator is connected between the output of the data pattern generator and a terminal which serves for connection to a data input of a component to be tested. With the construction described, the output signal of the data pattern generator is subjected to jitter and fed to the data input of the component to be tested. In the case of this first option, a clock signal may additionally be connected to a second terminal for connection to a clock input. It is also possible for the semiconductor component to be tested not to be connected to a clock, but rather to obtain the clock from the signal at the data input.

According to a second option, the jitter generator is connected to the output of a clock generator. The output of the jitter generator is connected to a second input terminal for connection to a clock input of the electrical component to be tested. The clock generator generates a clock having the test frequency $f_r$, which is equal to or an integer multiple of the sampling frequency $f_s$.

An output terminal serves for connection to the data output of the semiconductor component to be tested. The output terminal is connected to an input of an evaluation circuit. The evaluation circuit determines the jitter parameters of the input signal present at its input. The jitter parameters are determined from the low-frequency components of the input signal. Low-frequency components of the input signal are those frequency components of the input signal whose frequency is less than half the sampling frequency $f_s/2$.

The jitter parameters include the jitter frequency and the jitter amplitudes of a signal and also the jitter transfer coefficient of a semiconductor component. By virtue of the fact that the frequency of the analog basic signal is known, the jitter amplitude, the jitter frequency and the jitter transfer coefficient can be determined from the input signal of the evaluation device.

According to the present invention, the data signal, which heretofore was not used for determining the jitter parameters and could even be random, is used as an information carrier. Purely pseudorandom bit patterns have generally been used heretofore. An analog basic signal chosen such that the jitter can be measured is modulated onto the data signal.

The fact that the jitter parameters are determined at low frequencies means that the complexity for the measurement technology is considerably reduced, because the complexity for the measurement decreases with the frequency. Rather than special measuring instruments, standard measuring instruments which are also used for other measurements are used for the jitter measurement. The standard measuring instruments are less sensitive, require less labor for calibration and are additionally less expensive.

In one embodiment of the invention, the data pattern generator generates a delta-sigma-modulated data stream, which is also referred to as a pulse-width-modulated data stream, at its output. A delta-sigma-modulated data stream is a digital data stream generated by the sampling with a sampling frequency $f_s$ of an analog basic signal.

Delta-sigma modulator architectures are sensitive to jitter. The zero crossings of the binary digital pulses are readily shifted by the jitter in the clock signal, as a result of which the binary zeros and ones turn out to be sometimes shorter and sometimes longer, depending on the jitter. The consequence of this is that additional frequency components occur in the frequency spectrum both in baseband and at the high frequencies.

This leads to significant signal interference during the demodulation, i.e., the recovery of the analog signal. The sensitivity to jitter is extremely undesirable in audio applications, because this sensitivity leads to significant signal interference during the demodulation, i.e., the recovery of analog signal. Therefore, the modulators used therein are designed for maximum jitter robustness. According to the invention, by contrast, this property is utilized as a measurement principle. In this case, the modulators to be used are optimized for maximum jitter sensitivity. The jitter amplitude can be determined from the baseband signal spectrum altered by jitter.

Delta-sigma-modulated data streams generally have the "noise-shaping" property. The extent to which the error signal is shifted to high frequencies depends on the circuits used. In addition, the extent to which the modulated signal is influenced by jitter also depends on the circuits. Consequently, there are many possible options for finding an optimum of small error signal in baseband and high sensitivity to jitter by the choice of the circuits used. When defining which frequencies belong to the low-frequency component, on the one hand it must be taken into consideration that the error signal caused by the delta-sigma modulation does not belong to the low-frequency component. On the other hand, the frequencies of the analog harmonic signal and also the sidebands generated by the jitter frequency must belong to the low-frequency range as completely as possible.

For most applications, therefore, all frequencies which belong to the range resulting from the basic frequency $f_c$ and the largest of all the jitter frequencies $f_j$ according to the formula $f_c \pm k f_j$, where k is a natural number, belong to the low-frequency range. As a result, only the first k sidebands are considered, because the amplitudes of the higher sidebands are so small that they can be disregarded. In one embodiment, k is equal to 10. A broad frequency range is thus covered. In order to reduce the test costs further, k is set to be equal to eight or preferably six or preferably equal to three.

Another definition for the boundary between the low-frequency component and the other components is afforded by the criterion that the error signal of the delta-sigma modulation must be substantially suppressed in the low-frequency component.

In this case, "substantially" means that the error signal is suppressed to ten percent. It is preferable to choose three percent, preferably one percent and preferably two thousandths. In the most preferred case, the error signal is not measurable.

The evaluation unit considers only low-frequency components of the input signal of the evaluation device. Errors caused by the modulation are thereby masked out. Frequency components of the clock frequency $f_t$ are not taken into account either. Consequently, all that remain are the frequency components generated by the basic signal and by the jitter, in the low-frequency range. The information about the jitter parameters can be obtained therefrom.

If the basic signal constitutes a sinusoidal signal, the frequency components can readily be determined from the frequency spectrum at the data output of the electrical component to be tested since it only contains sidebands that effect little interference. In this context, sinusoidal denotes those signals which have the form of a sine function or a cosine function or a linear combination of sine and cosine functions.

In one embodiment of the invention, the basic signal constitutes a linear combination of sinusoidal functions having different frequencies $f_{ci}$. In this case, measurement is effected in one step simultaneously with a plurality of basic frequencies $f_{ci}$. Frequency spectra around these basic frequencies $f_{ci}$ arise at the data output. By means of this "multi-tone test", the measurement method is parallelized, which shortens the time for measuring the jitter parameters.

In order to generate the delta-sigma-modulated data stream, the data pattern generator may have a delta-sigma modulator. Such a modulator is an electrical circuit which samples an analog signal having a basic frequency $f_c$. The sampling is effected with the higher sampling frequency $f_s$. Such a delta-sigma-modulator, which is present at a dedicated electrical circuit, can be adapted particularly well to different requirements for the desired signal profile. This applies primarily to higher frequencies at which particular demands are made of screening and reflection behavior of the circuits used.

In a further embodiment, the data pattern generator has a memory for a digital signal sequence. The values stored in the memory are generated by the simulation of a delta-sigma modulation. The latter involves simulating how an analog harmonic signal having the basic frequency $f_c$ is sampled with the sampling frequency $f_s$. Registers that are available in any standard tester may be used as the memory for the digital signal sequence. Therefore, for the test device there is no need for a dedicated delta-sigma modulator to be realized as an electrical circuit, rather a simulation by software suffices. In this case, the simulation may be effected in a digital computer, e.g., a PC.

This saves space in the tester and obviates the need to specifically adapt the tester to the jitter test. During the simulation, the model of the delta-sigma modulator may be chosen as desired without having to give consideration to restrictions governed by circuit technology.

The model of the delta-sigma modulator is expediently chosen so as to produce a maximum sensitivity to the input jitter and so to optimize the signal/noise ratio within the signal band defined by the basic frequency $f_c$.

The jitter generator preferably contains a phase modulator having a first input and a second input. The phase modulator is connected to a clock generator at its first input. The clock generator generates a signal of the form $$u(t)=g_1(t).$$

In this case, $g_1$ is usually a function which generates a periodic clock.

A generator for generating a sinusoidal signal with the jitter frequency $f_j$ is connected to the second input of the phase modulator. The pulse generator generates a test clock with the aid of the two input signals, the test clock having the form $$u(t)=A_t g_1(t+\beta \sin(2\pi f_j t+\Phi)).$$

A deterministic jitter signal is thus applied to the test clock. This has the advantage that only the known jitter frequency has to be taken into account in the evaluation of the frequency components of the output signal. As a result, the spectral lines in the output signal can be unambiguously assigned their causes.

In this case, $g_1$ is preferably a digital function. In the case of digital functions, the instants for a signal change are precisely defined, so that during the evaluation of the signals it is readily possible to ascertain which signal parts belong to the jitter and which belong to the signal with the function $g_1$.

In a further embodiment, the jitter generator subjects a signal to jitter with the aid of a stochastic noise signal. The component to be tested can thus be tested simultaneously with a multiplicity of input jitter parameters.

In order to separate the low-frequency component of the input signal from the high-frequency components of the input signal, use may be made of a low-pass filter. The latter is part of the evaluation device and filters the input signal at the input of the evaluation device. The low-pass filter does not have to be directly connected to the first input, but rather may also be connected downstream of processing units, such as, e.g., amplifiers. The limiting frequency of the low-pass filter lies below the frequencies of the clock signal $f_t$ and half the sampling frequency $f_s$.

The low-pass-filtered output signal contains frequency components of the modulated basic signal and also frequency components directly in the vicinity thereof which were caused by the jitter.

The requirement made of the low-pass filter is for it to be as linear as possible and for the limiting frequency to lie somewhat above the baseband bandwidth. Therefore, a passive filter is used in order to meet the first condition, while the second condition is ensured by the setting of the limiting frequency of the low-pass filter.

In order to filter the signal at the input of the evaluation device, it is also possible to use a bandpass filter. The bandpass filter also filters out components of low frequencies, for example interference due to the external voltage supply at 50 Hz or 60 Hz.

Digital signal processing is particularly suitable for determining the frequency components generated by the jitter. Digital signal processing generally has the advantage that it exhibits long-term and thermal stability and that it is reliable and insensitive to interference. In order to make the output signal of the low-pass filter accessible to digital signal processing an analog-to-converter is connected to the output of the low-pass filter or of the bandpass filter.

The analog-to-digital converter converts the analog signal at the output of the low-pass filter into an n-value digital signal. This signal is fed to a computing unit, in which it is processed further. The signal may be transformed, e.g., by means of an FFT (Fast Fourier Transformation) in the frequency ranges where the different frequency components generated by the jitter can be read. The computing unit in which the digital output signal of the analog-to-digital converter is processed may be provided by the tester. However, it may also be mounted on the load board, e.g., in the form of an FPGA (Field Programmable Array).

It is also possible for the computing unit to be made available in the semiconductor component to be tested, provided that the latter has a processor unit. This reduces the terminals required for the test and avoids corruption of the measurement result by long lines on the load board.

In a further embodiment, the output signal of the low-pass filter is fed directly to a spectrum analyzer, which carries out the separation of the frequency ranges. This obviates the additional circuitry outlay for the analog-to-digital converter and reduces the risk of additional interference being generated by the analog-to-digital conversion.

The data pattern generator and the clock generator are preferably accommodated in a tester, while parts of the evaluation circuit and the terminals for connection to a component to be tested are formed on a load board. As a result, those parts of the test device which are specifically required for the test of the jitter parameters are realized on the load board, whereas those devices which are required for a multiplicity of tests are provided in the tester. During the jitter test, the already existing testers can thus be used without modification and only the load boards are specifically adapted to the jitter test.

The components of the test device, the data pattern generator, the jitter generator, the clock generator and the evaluation device may be integrated as BIST (Built-in Self-Test) individually or in combination in the semiconductor component to be tested. This advantageously reduces the signal lines between the components and the costs for the test device.

The invention also relates to a method for measuring jitter parameters. Such a method comprises the provision of a semiconductor component to be tested, having at least one data input and a data output. A further step involves generating a data stream by modulation of a basic signal, which has the basic frequency $f_c$ or a plurality of basic frequencies $f_{ci}$, by a sampling frequency $f_s$. The modulation has the "noise-shaping" property according to which the error signal of the modulation is shifted into high frequencies.

The semiconductor component is subsequently operated, in which case, in a first option, the digital data stream generated by the modulation is present at the data input and a clock signal subjected to jitter and having the clock frequency $f_t$ is present at a clock signal. In this case, the clock frequency $f_t$ is equal to or an integer multiple of the sampling frequency $f_s$. In a second option, the data stream obtained by the modulation is subjected to jitter and the data stream that has been subjected to jitter is applied to the data input.

The subsequent determination of the jitter parameters of the semiconductor component is effected by the assessment of the signal sequence at the data output of the semiconductor component. Only the low-frequency components of the signal sequence at the data output are assessed in this case.

The assessment of the low-frequency components of the signal sequence is significantly less complicated than a calculation of the entire signal spectrum. Low frequency is deemed to include the frequencies which are less than half the sampling frequency $f_s/2$ and are at a sufficient distance from half the sampling frequency $f_s/2$ without the error signal produced by the modulation being influenced.

Since the error signal is shifted into the high frequency range, the jitter in the low frequency range becomes visible in an uncorrupted manner. The circuitry outlay for measuring the jitter parameters is thus also significantly reduced. Standard test devices may be used instead of the special jitter test devices. This also simplifies the test process, because for the jitter measurement the semiconductor components to be tested thus no longer need be brought to special tester stations for the jitter measurement, but rather can be tested by the standard testers with a specific load board.

If the modulation used is a delta-sigma modulation, a desired optimum with regard to a high sensitivity to jitter and a small error signal in baseband can advantageously be chosen by means of a suitable choice of the circuits used.

If the low-frequency range is additionally restricted, the influence of the error signal is reduced. One embodiment of the invention provides the definition that all frequencies which are within the range $f_c \pm 3f_j$ belong to the low-frequency range. In the case where there are a plurality of basic frequencies $f_{ci}$, the largest of the basic frequencies $f_{ci}$ is used in the calculation. As a result, only the first k sidebands are considered, because the amplitudes of the higher sidebands are so small that they can be disregarded. k is chosen to be equal to 10, preferably eight or preferably six or preferably three.

Another definition for the boundary between the low-frequency component and the other components is afforded by the criterion that the error signal of the delta-sigma modulation must be substantially suppressed in the low-frequency component.

In this case, "substantially" means that the error signal is suppressed to ten percent. It is preferable to choose three percent, preferably one percent and preferably two thousandths. In the most preferred case, the error signal is not measurable.

The distribution of the error signal can be estimated by a simulation in which the limiting frequency is shifted.

The basic signal is advantageously sinusoidal. As a result, there are only few interfering sidebands which have to be taken into account in the evaluation.

If the basic signal comprises a linear combination of a plurality of sinusoidal functions with different frequencies, then a plurality of basic frequencies can be tested simultaneously.

If the step of determining the jitter parameter contains a step of low-pass filtering the signal sequence at the data output, the high-frequency components of the data output signal are filtered away and need no longer be taken into account in the subsequent processing steps. As a result, less complicated measuring devices can be used because they only have to evaluate low-frequency signals.

A bandpass filter may also be used instead of a low-pass filter. In the case of a bandpass filter, additional interference occurring at very low frequencies, for example at 50 Hz, is removed.

In one embodiment, the low-pass filtering or bandpass filtering of the signal sequence at the data output is followed by analog-to-digital conversion. As a result, the low-pass-filtered data output signal is available in digital form and can be processed further by digital signal processing. Digital signal processing has advantages with regard to thermal stability, reliability and low sensitivity to interference. Moreover, the results obtained by digital signal processing are readily reproducible, and measuring instruments having the same structural component types generally have the same properties and can readily be interchanged among one another.

If the delta-sigma-modulated data stream is generated by cyclically reading out from a data register, the pattern of the data stream need only be generated once. This may be effected for example by calculating a softer model of a delta-sigma-modulator. A register that is already present in a standard tester may be used as the register, so that there is no need to provide additional circuits for the delta-sigma-modulator.

During the generation of the delta-sigma-modulated signal, preferably a harmonic analog basic signal having a basic frequency $f_c$ is sampled with a sampling frequency of $f_s$. The fact that a harmonic analog signal is used means that there are only few frequency characteristic curves which have to be taken into account in the evaluation of the data output signal, which facilitates the calculation of the jitter parameters.

If the clock signal subjected to jitter is generated by phase modulation of the clock signal or of the delta-sigma-modulated data stream with a harmonic signal having the jitter frequency $f_j$, a deterministic jitter is applied to the test signal. The phase and amplitude thereof are known, so that the characteristic figures for the jitter transfer coefficient and the jitter tolerance are calculated from the comparison of the data output signal with the known values for the input jitter. In the evaluation of the jitter parameters, the jitter amplitude of the signal sequence at the data output is determined from the jitter amplitudes of the low-frequency components at the data output.

On account of the clock signal being subjected to jitter in a targeted manner with the sinusoidal signal having the frequency $f_j$, a phase-modulated sinusoidal signal having the basic frequency $f_c$ and the modulation frequency $f_j$ appears in the output spectrum of the analog output signal. The frequency spectrum of a harmonic signal which is phase-modulated with a second harmonic signal is described by the Bessel functions. The amplitude of the modulating signal can be calculated from the ratio of the amplitudes of the Bessel lines. This value corresponds to the maximum excursion of the jitter, which is also called "peak-to-peak" jitter. The comparison of the amplitudes with the Bessel functions has the advantage that the values can be read from existing tables and complicated calculation of the modulation is not required.

In the case where the jitter amplitude is very much less than 1, for example 0.1, the square of the jitter amplitude can be calculated from the ratio of double the power of the side lines through the power of the basic frequency. This method step affords a further simplification for comparison with respect to other embodiments.

The jitter frequency can be determined by the spacing of the low-frequency spectral lines by considering the spacing of the spectral line at the basic frequency $f_c$ with respect to the remaining spectral lines.

Particularly if the electrical component to be tested has a device for jitter attenuation, the jitter transfer coefficient has to be measured. Such a device is a "clean-up PLL", for example, which reduces jitter present within a predetermined frequency range by a specific magnitude. The output signal contains the same data sequence as the input signal but the jitter component is attenuated by a specific amount. In order to measure this, the jitter amplitude of the input signal of the semiconductor component is divided by the jitter amplitude of the output signal, which produces the jitter transfer coefficient.

The invention will now be explained in more detail with reference to the accompanying figures.

DETAILED DESCRIPTION

Figure 1:
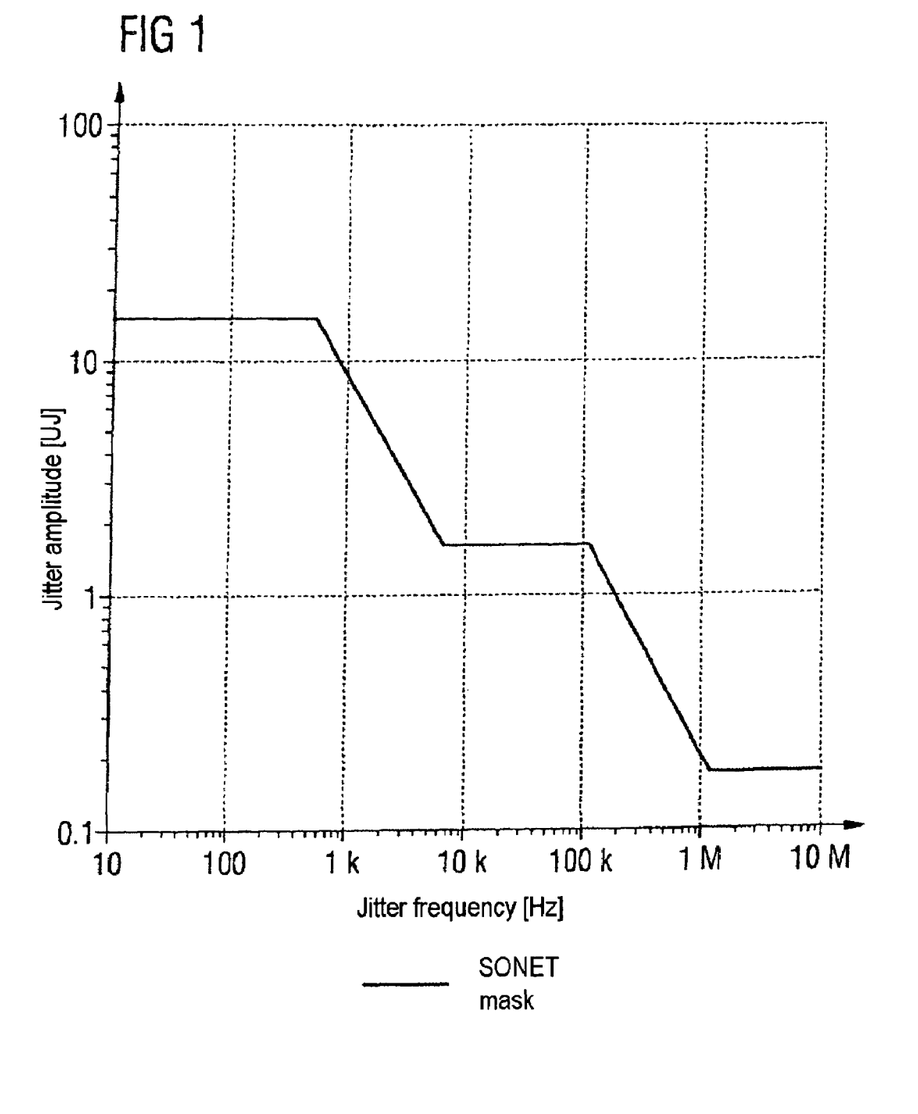
FIG. 1 shows a specified jitter transfer characteristic curve of a semiconductor component to be tested.

FIG. 1 shows the specified jitter transfer characteristic curve of a semiconductor component to be tested. For this purpose, the jitter amplitude is plotted against the jitter frequency in double logarithmic representation.

The jitter amplitude is represented in the UI unit. UI is the abbreviation for Unit Interval. It specifies the fraction of the length of the data interval. In the equation $$u(t)=\text{square}(f_t t+\beta \sin(2\pi f_j t+\Phi))$$

the quantity $\beta$ has the Unit Interval unit. The clock frequency $f_t$ shall be $(2T_1)^{-1}$. If $\beta$ is equal to 0.1 UI, for example, then the amplitude of the jitter is equal to 0.1 times $T_t$. In this case, $T_t$ corresponds to the time for which u(t) remains a constant value. The phase of the clock edge thus fluctuates temporally forward and backward by 0.05 $T_t$ in each case about a middle position. The jitter frequency $f_t$ has the hertz unit. The range shown extends from 10 Hz to 10 MHz.

The jitter transfer characteristic curve, which is designated as SONET mask in FIG. 1, specifies the jitter frequency and the jitter amplitude at which a jitter must be attenuated. By way of example, given a jitter amplitude of one UI, the component must have suppressed the jitter modulated on at the input starting from a frequency of approximately 160 kHz. The transfer characteristic curve decreases as the jitter frequency increases. Jitter which has a small amplitude must also be suppressed at higher jitter frequencies.

Figure 2:
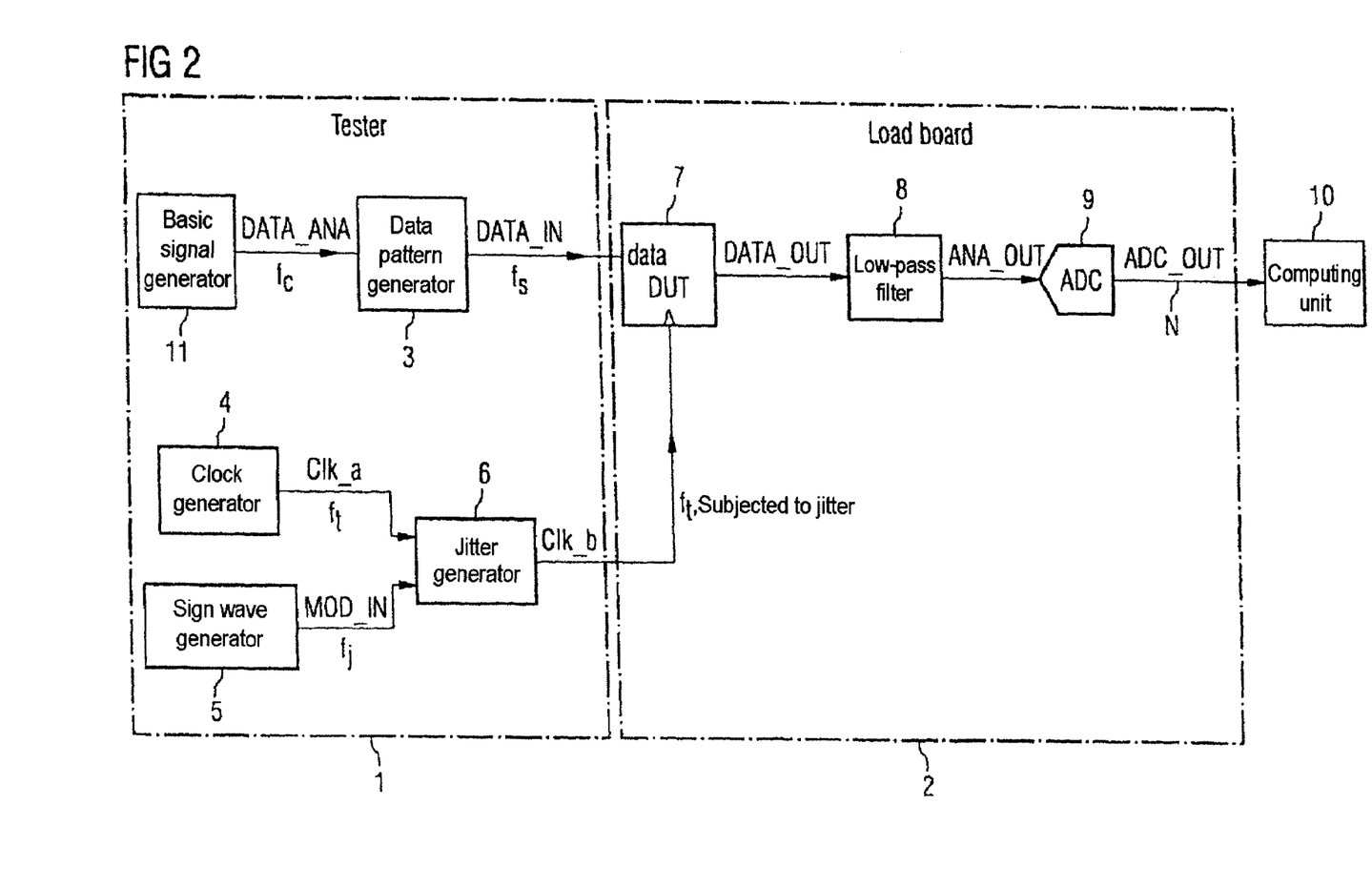
FIG. 2 shows a test device according to the invention for determining the output jitter and he jitter transfer coefficient of a semiconductor component to be tested.

A test device according to the invention is illustrated schematically in FIG. 2. It contains a tester 1, a load board 2 and also a computing unit 10. A basic signal generator 11, a data pattern generator 3, a clock generator 4, a sine wave generator 5 and a phase modulator 6 are accommodated in the tester 1. A semiconductor component 7 to be tested, which is also referred to as a DUT, and also a low-pass filter 8 and an analog-to-digital converter 9 are situated on the load board 2.

The clock generator 4 in the tester 1 generates a clock signal Clk_a having the frequency $f_t$, which supplies the phase modulator 6. The sine wave generator 5 generates a sinusoidal signal MOD_IN having the frequency $f_j$, which is connected to the second input of the phase modulator. The output of the phase modulator 6 supplies the signal Clk_b, which operates the clock input of the semiconductor component 7 to be tested on the load board 2.

A sinusoidal signal DATA_ANA of the form $\sin(2\pi f_c t)$ is generated in the basic signal generator 11.

The data pattern generator 3 generates from this the signal DATA_IN having the frequency $f_s$, which is connected to the data input of the semiconductor component 7 to be tested. The electrical component 7 to be tested outputs the signal DATA_OUT which is connected to the input of the analog-to-digital converter 9 via the low-pass filter 8. The analog-to-digital converter 9 generates the digital signal ADC_OUT having a width of N bits.

The clock generator 4 generates a high-frequency, frequency-stable system clock Clk_a having the clock frequency $f_t$ of 139.264 MHz. This frequency corresponds to the DS4N interface specification for SONET. The clock signal is a regular sequence of, considered digitally, ones and zeros.

By contrast, the sine wave generator 5 generates a sine wave MOD_IN having the frequency $f_j$, which is 500 Hz in the example under consideration. The signal generator 5 should likewise be as frequency-stable as possible in order that the measurement result is not corrupted.

In the phase modulator 6, a clock signal is generated which has the same frequency has the input clock Clk_a but is additionally phase-modulated. This means that, e.g., the zero-one transitions are not effected in each case at the beginning of a new clock cycle, rather they are in each case shifted forward or backward. A clock signal artificially subjected to jitter has consequently been generated. The amplitude of the jitter shall be $\beta$. This can be set in a targeted manner either by the sine wave generator or in the phase modulator.

A data pattern DATA_IN having the sampling frequency $f_s$ is generated in the data pattern generator 3. The data pattern is also referred to hereinafter as a data stream. It is generated from the basic signal DATA_ANA by the signal being subjected to delta-sigma modulation.

A delta-sigma-modulator converts an analog basic signal into a binary data sequence. Delta-sigma modulations are known for example from the book "Delta-Sigma-Data Converters" by Norsworthy, Schreier and Temes, IEEE Press.

Correspondingly converted data streams are also referred to as pulse-width-modulated data streams. In this case, the bandwidth of the analog signal is very much smaller than that of the digital signal.

The electrical component 7 to be tested receives the pulse-width-modulated data signal DATA_IN by means of the clock Clk_b subjected to jitter. Delta-sigma architectures are described as sensitive to jitter. The zero crossings of the binary digital pulses are shifted slightly by jitter in the clock signal. As a result, the binary zeros and ones turn out to be sometimes shorter and sometimes longer depending on the jitter. In the frequency spectrum, both the baseband and the high frequencies additionally have frequency components.

The electrical component 7 to be tested has a device which reduces the jitter at its clock input. At the output DATA_OUT a measurement is made of how much jitter has been filtered by the output signal DATA_OUT firstly being connected via a low-pass filter 8. The output signal of the low-pass filter 8 is an analog phase-modulated sinusoidal signal having the basic frequency $f_c$ and a modulation frequency $f_j$.

The calculation is effected in the computing unit 10. In this case, the signal ANA_OUT is converted into a digital signal ADC_OUT by an analog-to-digital converter 9. The digital signal ADC_OUT is used by the computing unit 10. This performs, for example, a transformation into the frequency domain and calculates the jitter parameters from the frequency spectrum by comparison with the Bessel lines.

The frequency spectrum of this harmonic signal, which is phase-modulated with the second harmonic signal, is described by the Bessel function. The amplitude of the modulating signal can be calculated from the ratio of the amplitudes of the Bessel lines. This value corresponds to the "peak-to-peak" jitter of the digital data stream DATA_OUT.

The ratio between the jitter amplitude thus determined and the amplitude of the signal MOD_IN modulated in a targeted manner yields the jitter transfer coefficient sought.

Figure 3:
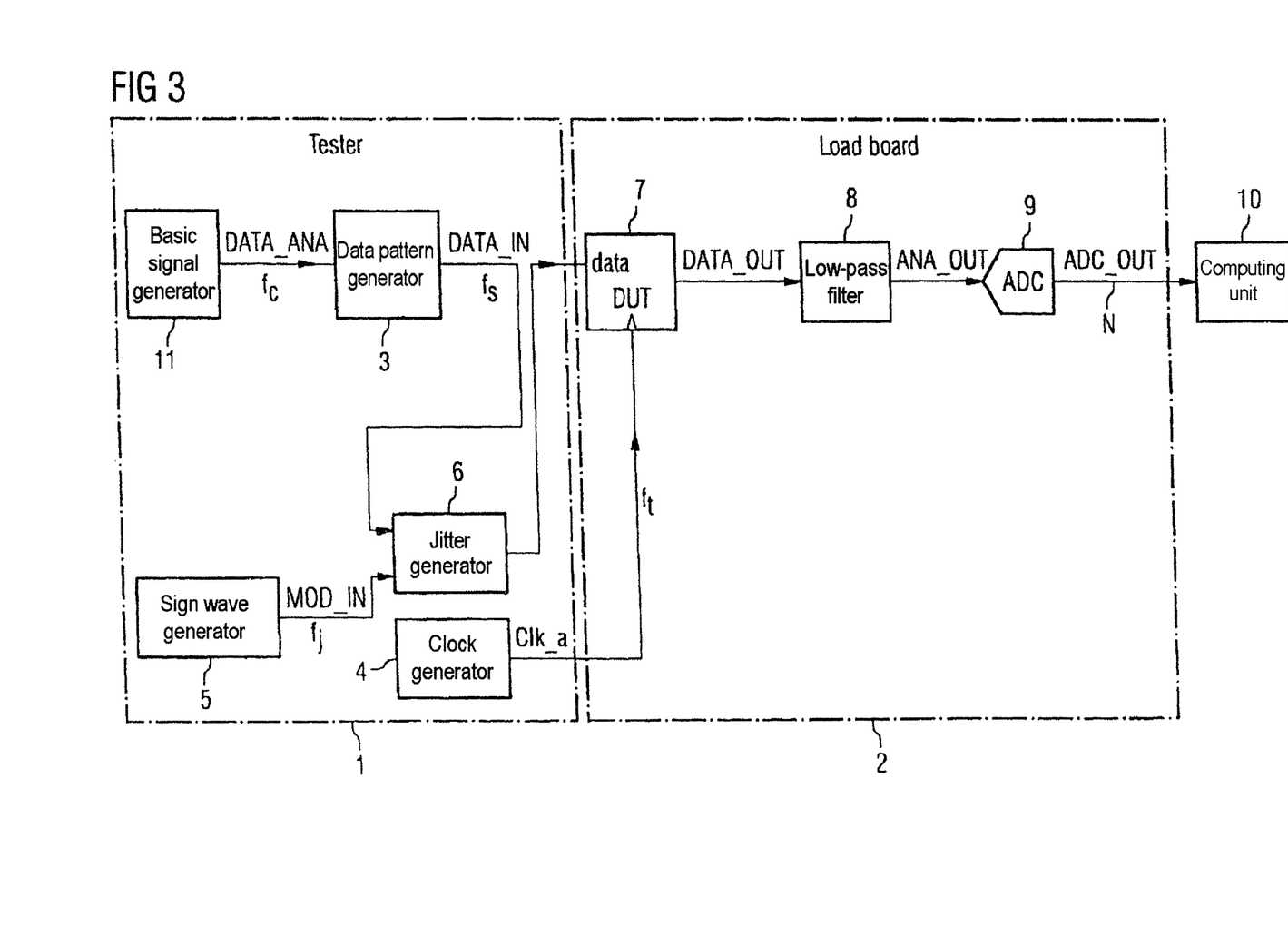
FIG. 3 shows a further exemplary embodiment of the test device according to the invention for determining the output jitter and the jitter transfer coefficient of a semiconductor component to be tested.

FIG. 3 shows a further exemplary embodiment of the test device according to the invention. Elements having identical functions are provided with the same reference symbols and are not explained separately. In contrast to the exemplary embodiment in FIG. 2, the data stream DATA_IN rather than the clock signal Clk_a is subjected to jitter. Therefore, the phase modulator 6 is connected between the output of the data pattern generator 3 and the data input of the electrical component 7 to be tested. The clock Clk_a not subjected to jitter is connected to the clock input of the electrical component 7 to be tested.

In the case where the sampling frequency $f_s$ and the clock frequency Clk_a are identical, the clock generator 4 advantageously feeds the data pattern generator 3 as well. This ensures that no additional interference occurs as a result of the use of different clock generators.

In an embodiment of the invention that is not shown, the electrical component 7 to be tested does not have a separate clock input. Rather, it generates an internal clock from the data signal present at a data input. Consequently, the output of the clock generator 4 is connected only to a clock input of the data pattern generator 3, and not to a clock input of the electrical component 7 to be tested.

Figure 4A:
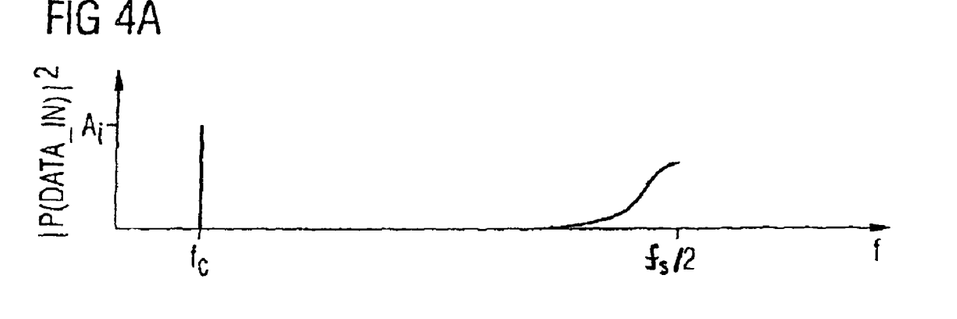
FIGS. 4A to 4E illustrate the signal profiles at the nodes shown in FIG. 2.

FIG. 4A shows the frequency spectrum of the signal data DATA-IN in order to illustrate the "noise-shaping" effect. The power density of the spectral lines is plotted against the frequency. In baseband, there is only one spectral line at the basic frequency $f_c$ having the amplitude $A_t$; the remaining spectral lines can be disregarded owing to their small amplitudes. At the higher frequencies, by contrast, there is a broad distribution of spectral lines, the spectral line with the largest amplitude lying at half the sampling frequency $f_s/2$.

Figure 4B:
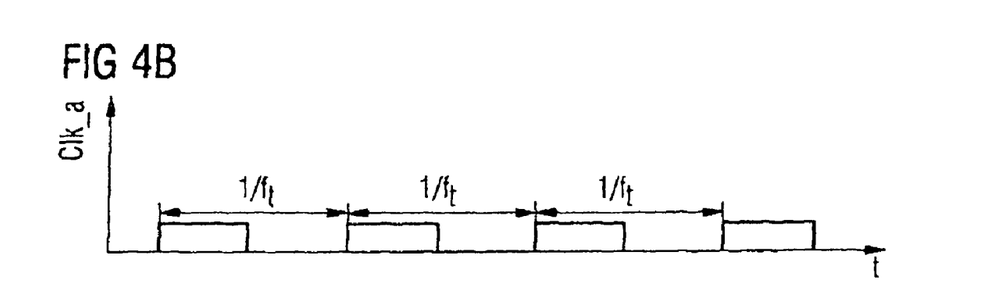

In FIG. 4B, the clock signal Clk_a provided by the clock generator 4 in accordance with FIG. 2 is plotted against the time t. The signal Clk_a is distinguished by a phase-stable clock. The rising edges of the clock signal always follow one another at a time interval that results from the reciprocal of the frequency $f_t$.

Figure 4C:
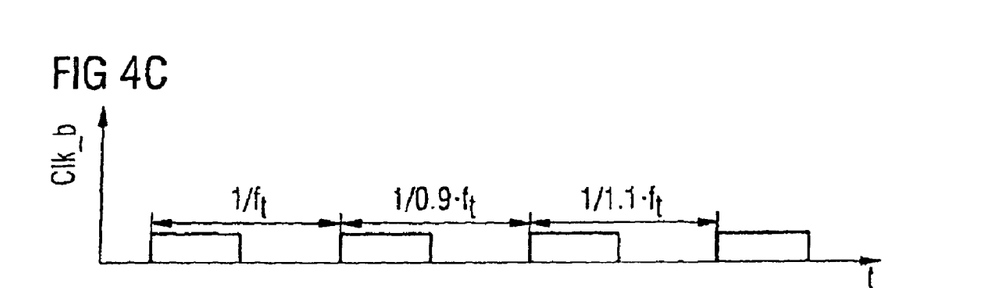

The clock Clk_b, by contrast, has been subjected to jitter in a targeted manner by means of the phase modulator 6. FIG. 4C illustrates by way of example how the third clock signal has been phase-shifted with regard to its rising edge and thus subjected to jitter.

The time between the second and third clock edges is no longer equal to the reciprocal of the clock frequency $f_t$, but rather is calculated from the reciprocal of 0.9 times $f_t$. The fourth rising edge of the clock signal Clk_b was not phase-shifted. The time between the first and fourth clock edges amounts overall to three times the reciprocal of the clock frequency $f_t$. The spacing between the third and fourth edges is equal to the reciprocal of 1.1 times the clock frequency $f_t$. For the illustration in FIG. 4C only one edge has been shifted by way of example. Given the values that are usually chosen for the jitter frequency $f_j$ and the clock frequency $f_t$, all the edges are shifted with respect to one another.

The electrical component to be tested receives the data stream DATA_IN at its data input and the test clock Clk_b as clock signal. It outputs the data signal DATA_OUT at its output.

Figure 4D:
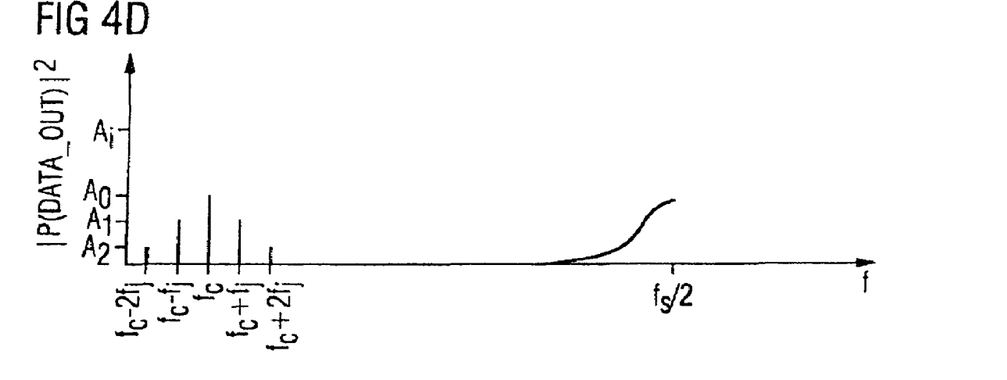

The data signal DATA_OUT contains a power density spectrum whose positive sideband is reproduced in FIG. 4D. The data signal DATA_OUT has a frequency line at the frequency of the basic signal. Since the data stream DATA_OUT was received with a clock subjected to jitter, further frequency lines result at spacings of multiples of the jitter frequency $f_j$.

In the high frequency range, further frequency lines are situated in the vicinity of half the sampling frequency $f_s$.

Additional spectral lines are apparent compared with the power density spectrum of the data input signal DATA_IN as illustrated in FIG. 4A. It has spectral lines centered about the basic frequency $f_c$. These are at a spacing of $f_j$ or multiples of $f_j$ from the spectral line at the basic frequency $f_c$. The amplitude of the spectral line at $f_c$ has decreased from $A_t$ to $A_0$. The amplitudes of the spectral lines situated at a spacing of $f_j$ from the spectral line at $f_c$ are $A_1$; the spectral lines at a spacing of $2f_j$ have amplitudes of $A_2$.

Higher-order spectral lines in baseband are not depicted in FIG. 4D. Their amplitudes are so small that they need not be taken into account in most calculations.

Figure 4E:
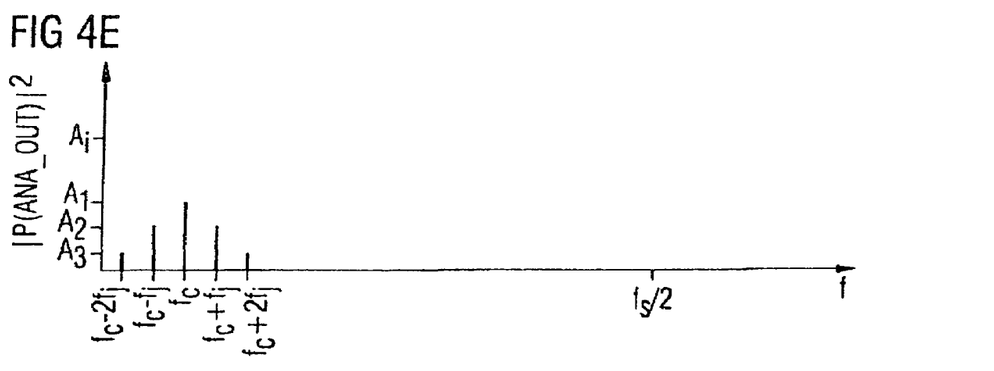

After the data output stream DATA_OUT has been low-pass-filtered, the result is a frequency spectrum as illustrated in FIG. 4E. This differs from the power density spectrum in FIG. 4D by virtue of the fact that the frequency lines about the frequency line at $f_s/2$ have been filtered away by the low-pass filter. The jitter amplitude can now be calculated from the frequency spectrum of FIG. 4E. Use is made here of the fact that the power density spectrum of a harmonic signal which is phase-modulated with a second harmonic signal is described by the Bessel function.

Figure 5:
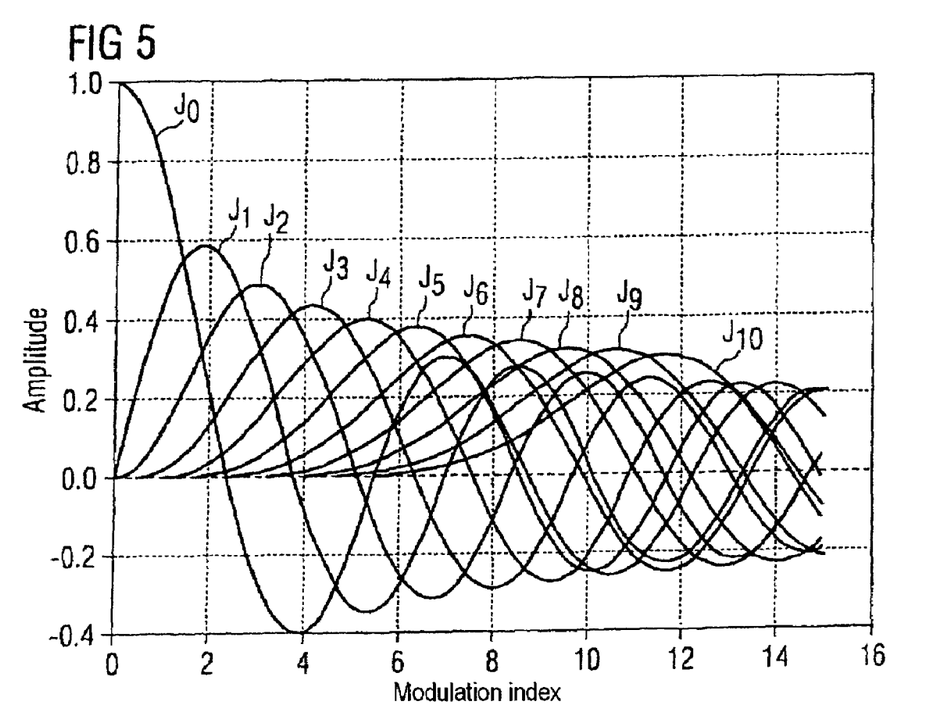
FIG. 5 shows the Bessel functions of the first kind.

FIG. 5 shows the Bessel functions of the first kind of order zero to ten. In this case, the function values $J_0$ to $J_{10}$ of the Bessel function are plotted against a modulation index. The ratio of the amplitude values $A_0$, $A_1$ and $A_2$ corresponds to the ratio of function values $J_0$, $J_1$ and $J_2$ at specific modulation indexes. Thus, firstly the amplitude values $A_0$, $A_1$ and $A_2$ are determined from the power density spectrum of the signal ANA_OUT and this is followed by determining the modulation index for which the ratios of $J_0$, $J_1$ and $J_2$ are equal to the ratios of $A_0$, $A_1$ and $A_2$ with respect to one another. This modulation index corresponds to the jitter amplitude at the data output of the semiconductor component to be tested.

The value for the jitter transfer can be subsequently be calculated from the value for the jitter amplitude by determining the ratio of the jitter amplitude at the output and the jitter amplitude $\beta$ of the clock signal Clk_b.

Figure 6:
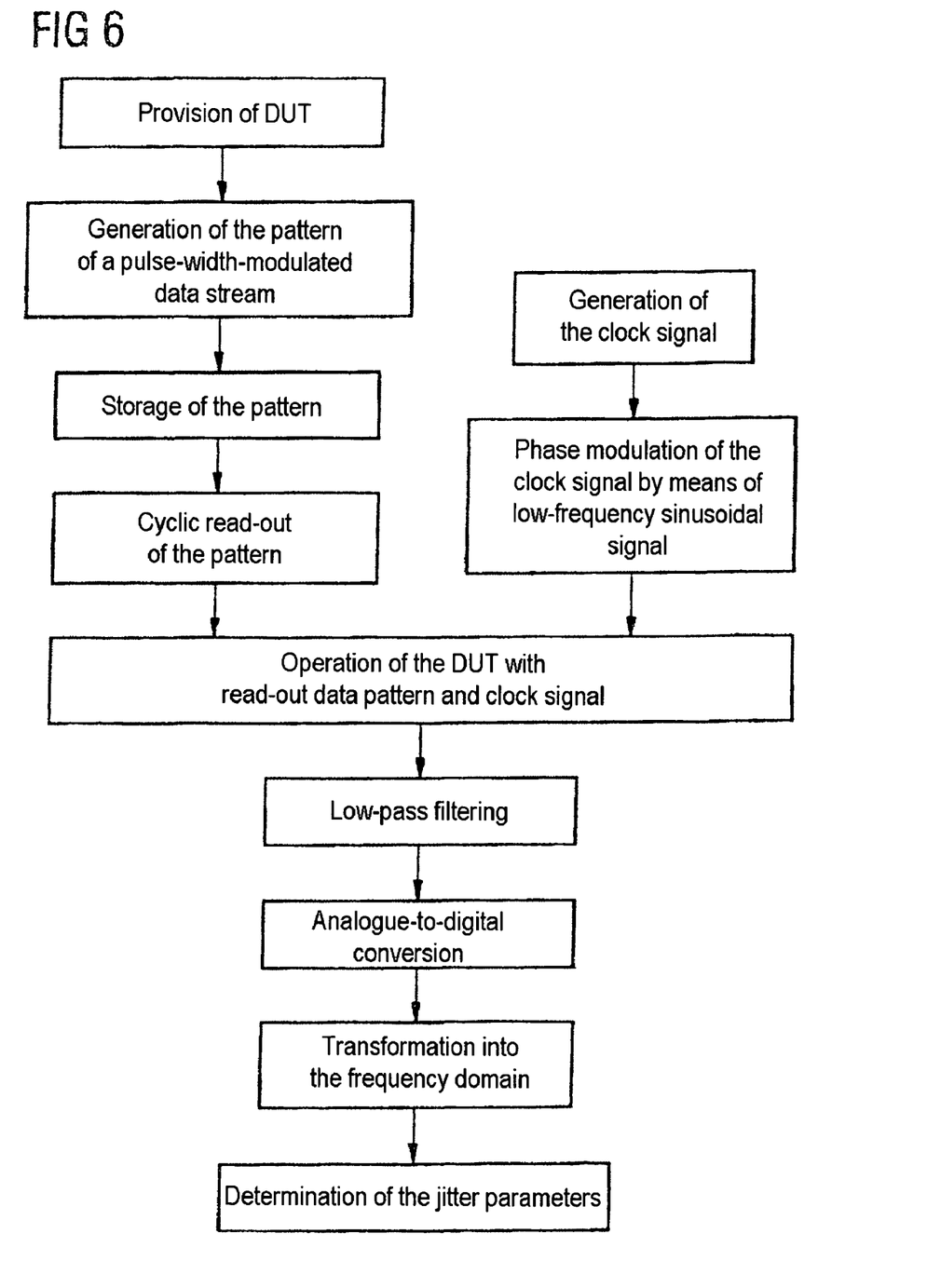
FIG. 6 illustrates a flowchart showing the test method according to the invention for determining the jitter parameters of a semiconductor component.

A method according to an exemplary embodiment of the invention is shown in FIG. 6. A first step involves providing a semiconductor component to be tested, also referred to as a DUT. A pattern of a pulse-width-modulated data stream is subsequently generated. In this case, a low-frequency basic signal is converted into a high-rate digital data stream by delta-sigma modulation. The low-frequency basic signal may be a sinusoidal signal having a basic frequency $f_c$ or a linear combination of a plurality of sinusoidal signals having different basic frequencies $f_{ci}$. Sampling is effected with a sampling frequency $f_s$ during the delta-sigma modulation. The sampling frequency $f_s$ must be significantly higher than the basic frequency $f_c$ or the basic frequencies $f_{ci}$. The delta-sigma modulator is either present as an electrical circuit or is simulated by a software model.

The calculation of the data stream with the aid of the software model is preferably not effected in a tester, but rather during the test preparation once on a digital computer. A special signal generator is not required in this case. After the pattern has been generated, it is stored in a test program or in a register of the tester. The data pattern is read out cyclically and a data stream is thus generated. The latter feeds the data input of a semiconductor component to be tested.

A clock signal which has been phase-modulated by a low-frequency sinusoidal signal is generated at the same time. The edges of the clock signal are thereby shifted. The clock signal is thus artificially subjected to jitter. This clock signal artificially subjected to jitter is applied to the clock input of the semiconductor component to be tested. The electrical component to be tested is operated with the data stream and the phase-modulated clock signal.

The output signal of the semiconductor component is filtered by an analog low-pass filter. The low-pass filter removes frequency components resulting from the sampling and frequency components resulting from the error during the delta-sigma modulation. Frequency components resulting from the basic signal and the jitter signal remain.

The analog signal that has been filtered by the low-pass filter is converted into a digital signal, for example by means of an AD converter, from which the frequency components are determined.

The discretized data present in the time domain are transformed into the frequency domain in a subsequent step. This may be effected for example by an FFT (Fast Fourier Transformation). The sampling rate of the AD converter must be at least a factor of two higher than the sum of basic frequency and the highest Bessel line $k*f_j$ taken into account. It is thus possible to identify the spectral lines generated by the jitter in the vicinity of the basic frequency $f_c$. The jitter parameters are determined by evaluation of the data present in the frequency domain. The power densities at the basic frequency $f_c$ and at the adjacent frequencies $f_c+f_j$, $f_c-f_j$, $f_c+2f_j$, $f_j$, $f_c-2f_j$, ... are considered in this case. These are compared with the function values of the Bessel function of the first kind. The jitter amplitude can be determined from this comparison. If the jitter amplitude determined in this way is compared with the jitter amplitude of the clock signal, it is possible to calculate how much jitter was masked out by the semiconductor component to be tested. This indicates the jitter transfer coefficient. If the method is carried out at a plurality of test frequencies, the jitter transfer characteristic curve is produced from this.

If the basic signal contains a plurality of different basic frequencies $f_{ci}$, jitter parameters for a plurality of basic frequencies are calculated simultaneously by the method shown in FIG. 6. This shortens the time required for determining the characteristic curves, e.g., the jitter characteristic curves.

Having described preferred embodiments of the invention, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

LIST OF REFERENCE SIGNS

1 Tester
2 Load board
3 Data pattern generator
4 Clock generator
5 Sine wave generator
6 Jitter Generator
7 Semiconductor component
8 Low-pass filter
9 Analog-to-digital converter
10 Computing unit
11 Basic signal generator

What is claimed is:

1. A test device for measuring jitter, comprising:
a data pattern generator operable to generate a data stream by modulation of an analog low-frequency basic signal with a sampling frequency $f_s$, the basic signal having the basic frequency $f_c$ or a plurality of basic frequencies $f_{ci}$, the sampling frequency $f_s$ being greater than the basic frequency $f_c$ or the basic frequencies $f_{ci}$, and the modulation having a noise-shaping property;
a first input terminal configured to connect to a data input of a semiconductor component to be tested;
a clock generator operable to generate a test clock with the clock frequency $f_t$ that is equal to or an integer multiple of the sampling frequency $f_s$;
a jitter generator operable to generate jitter on a signal, the jitter generator being connected either between an output of the data pattern generator and the first input terminal or between the clock generator and a second input terminal for connecting to a clock input of the semiconductor component to be tested;
an output terminal for connecting a data output of the semiconductor component to be tested to an input of an evaluation device; and
the evaluation device which determines the jitter parameters from a low-frequency component of an input signal at the input of the evaluation device, the low-frequency component containing only frequency components of frequencies that are less than half the sampling frequency $f_s/2$.

2. The test device of claim 1, wherein the data stream at the output of the data pattern generator is generated by a delta-sigma modulation.

3. The test device of claim 2, wherein the low-frequency component has only frequency components for which the error signal of the delta-sigma modulation is substantially suppressed.

4. The test device of claim 1, wherein the low-frequency component contains only frequency components of frequencies which lie within a range calculated from the basic frequency $f_c$ and a jitter frequency $f_j$ according to the formula $f_c \pm k*f_j$, where k is a natural number less than 10.

5. The test device of claim 1, wherein the basic signal is sinusoidal.

6. The test device of claim 1, wherein the basic signal constitutes a linear combination of a plurality of sinusoidal functions with different frequencies $f_{ci}$.

7. The test device of claim 1, wherein the data pattern generator includes a memory for a digital signal sequence, and wherein values stored in the memory are a simulation-generated, delta-sigma-modulated analog sinusoidal basic signal.

8. The test device of claim 1, wherein the test clock frequency $f_t$ is equal to the sampling frequency $f_s$ and the output of the clock generator is connected both to an input of the test pattern generator and to the second input terminal.

9. The test device of claim 1, wherein the jitter generator comprises a phase modulator including a first input and a second input.

10. The test device of claim 9, wherein the phase modulator generates from an input signal $$u_{in}(t)=g_1(t)$$

at the first input and a sinusoidal signal at the second input an output signal of the form $$u_{out}(t)=g_1(t+\beta g_2(2\pi f_j t+\theta))$$

where $g_2$ is a sinusoidal function, $\beta$ is the jitter amplitude, $f_j$ is the jitter frequency, and $\theta$ is the jitter phase.

11. The test device of claim 10, wherein $g_1$ is a digital function where $g_1(t)=g_1(nT_s)$.

12. The test device of claim 1, wherein the jitter generator subjects a signal to jitter with a stochastic noise signal.

13. The test device of claim 1, wherein the evaluation device comprises a low-pass filter that filters the signal present at the input of the evaluation device.

14. The test device of claim 13, wherein the evaluation device comprises an analog-to-digital converter, an input of which is connected to the output of the low-pass filter.

15. The test device of claim 13, wherein the evaluation device comprises a spectrum analyzer connected to the output of the low-pass filter.

16. The test device of claim 1, wherein the evaluation device comprises a bandpass filter that filters the signal present at the input of the evaluation device.

17. The test device of claim 1, wherein the evaluation device comprises a transform device for transformation into the frequency domain, the transform device transforming the input signal of the evaluation device or a signal produced from the further processing of the input signal into the frequency domain.

18. The test device of claim 1, further comprising:
a tester that includes the data pattern generator and the jitter generator; and
a load board that includes at least parts of the evaluation circuit and the terminals for connecting to the semiconductor component to be tested.

19. The test device of claim 1, wherein at least one of the data pattern generator, the jitter generator, the clock generator, and the evaluation device is integrated in the semiconductor component to be tested as a built-in self-test.

20. A method for measuring jitter parameters, comprising:
a) generating a digital data stream by modulation of an analog basic signal having the basic frequency $f_c$ or the basic frequencies $f_{ci}$ by sampling with a sampling frequency $f_s$, the modulation having a noise-shaping property and the sampling frequency $f_s$ being greater than the basic frequency $f_c$ or the basic frequencies $f_{ci}$;
b) applying the digital data stream to a data input of a semiconductor component to be tested after the digital data stream has been subjected to jitter, or applying to a clock input of the semiconductor component a clock signal that has been subjected to jitter and has a clock frequency $f_t$ equal to or an integer multiple of the sampling frequency $f_s$; and
c) determining the jitter parameters of the semiconductor component from a signal sequence at a data output of the semiconductor component by assessing low-frequency components of the signal sequence at the data output of the semiconductor component, the low-frequency component containing only frequency components of frequencies which are less than half the sampling frequency $f_s/2$.

21. The method of claim 20, wherein:
the clock signal or the data stream is subjected to jitter with the aid of a periodic signal having a jitter frequency $f_j$; and
a) includes modulating with a delta-sigma modulation.

22. The method of claim 21, wherein the low-frequency component includes only frequency components for which the error signal of the delta-sigma modulation is substantially suppressed.

23. The method of claim 22, wherein the delta-sigma-modulated data stream is generated by cyclic read-out from a data register.

24. The method of claim 20, wherein the low-frequency component contains only frequency components of frequencies which lie within the range calculated from the basic frequency $f_c$ and a jitter frequency $f_j$ according to the formula $f_c \pm k^* f_j$, where k is a natural number less than 10.

25. The method of claim 20, wherein the basic signal is sinusoidal.

26. The method of claim 20, wherein the basic signal comprises a linear combination of a plurality of sinusoidal functions with different frequencies.

27. The method of claim 20, wherein c) includes low-pass filtering of the signal sequence at the data output.

28. The method of claim 27, wherein c) includes analog-to-digital converting after the low-pass filtering.

29. The method of claim 20, wherein c) includes bandpass filtering of the signal sequence at the data output.

30. The method of claim 20, wherein the clock signal or the digital data stream is subjected to jitter by phase modulation with a harmonic signal having a jitter frequency $f_j$.

31. The method of claim 20, wherein c) includes a jitter amplitude is determined by comparing amplitudes of low-frequency spectral lines with function values of Bessel functions.

32. The method of claim 31, wherein c) includes calculating the square of the jitter amplitude by dividing a power of sidebands f the basic frequency by a power at the basic frequency $f_c$.

33. The method of claim 20, wherein c) includes determining a jitter frequency $f_j$ by a spacing of spectral line at the basic frequency $f_c$ from remaining spectral lines.

34. The method of claim 20, wherein a jitter transfer coefficient is determined by dividing a jitter amplitude at an input by a jitter amplitude at the data output of the semiconductor component.

* * * * *